(12) United States Patent
Notani

(10) Patent No.: US 7,321,170 B2
(45) Date of Patent: Jan. 22, 2008

(54) HIGH FREQUENCY SEMICONDUCTOR DEVICE

(75) Inventor: Yoshihiro Notani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 192 days.

(21) Appl. No.: 11/349,087

(22) Filed: Feb. 8, 2006

(65) Prior Publication Data

US 2006/0187977 A1    Aug. 24, 2006

(30) Foreign Application Priority Data

Feb. 24, 2005  (JP)  ............... 2005-049042

(51) Int. Cl.
*H01L 23/48*  (2006.01)
(52) U.S. Cl. .............. 257/773; 257/734; 324/765
(58) Field of Classification Search .......... 257/734, 257/745, 773, 775, 780, 784, 786, E29.111, 257/E29.112, E23.02, E23.015; 324/754–758, 324/763, 765–769; 438/17
See application file for complete search history.

(56) References Cited

U.S. PATENT DOCUMENTS 5,051,810 A * 9/1991 Katoh .................. 257/786
6,555,907 B2 * 4/2003 Katoh .................. 257/728
2002/0167083 A1 * 11/2002 Chaki .................. 257/728

FOREIGN PATENT DOCUMENTS

| JP | 60-249374 | 12/1985 |
|---|---|---|
| JP | 2002-334935 | 11/2002 |

* cited by examiner

Primary Examiner—Zandra V. Smith
Assistant Examiner—Paul E Patton
(74) Attorney, Agent, or Firm—Leydig, Voit & Mayer, Ltd.

(57) ABSTRACT

A high frequency semiconductor device includes a semiconductor substrate, a high frequency semiconductor element on the semiconductor substrate, a high frequency signal transmission line connected at a first end to the high frequency semiconductor element, a high frequency signal input/output pad connected to a second end of the high frequency signal transmission line, the high frequency signal input/output pad extending perpendicular to the length direction of the high frequency signal transmission line, and ground potential pads on opposite longitudinal sides of the high frequency signal input/output pad.

9 Claims, 8 Drawing Sheets

HIGH FREQUENCY SEMICONDUCTOR DEVICE

BACKGROUND OF THE INVENTION

1. Field of the Invention

The present invention relates to a high frequency semiconductor device.

2. Background Art

In conventional high frequency semiconductor devices, high frequency signal input/output pads are formed on the semiconductor substrate to receive and output high frequency signals (see, e.g., Japanese Patent Laid-Open No. 60-249374).

When a high frequency semiconductor element is mounted in a package, the high frequency signal input/output pads are usually electrically connected to terminals of the package by gold wires having a diameter of approximately 25 μm. At that time, ground potential pads provided on opposite sides of each input/output pad are wire-bonded (to ground) to reduce degradation in the characteristics of the portions of the input/output pads to which the gold wires have been connected.

The high frequency characteristics of the high frequency semiconductor element are measured by pressing probes connected to a high frequency characteristics measuring device against the high frequency signal input/output pads and inputting or receiving high frequency signals. The tip of such a probe includes: a high frequency signal transmission probe for inputting or receiving a high frequency signal; and ground potential probes provided on opposite sides of the high frequency signal transmission probe. On the high frequency semiconductor element, the ground potential pads (provided on opposite sides of each high frequency signal input/output pad) are disposed at positions corresponding to the ground potential probes.

Incidentally, high frequency semiconductor devices typically employ a GaAs substrate having a thickness of approximately 100 μm. Therefore, when a microstrip transmission line is formed on the high frequency semiconductor element, the line width of the high frequency signal transmission line is set to approximately 70 μm to set the characteristic impedance to approximately 50 O. As a result, the line width of the high frequency signal input/output pad connected to the high frequency signal transmission line is also set to approximately 70 μm. (The input/output pad is formed as an extension of the transmission line.)

However, conventional high frequency semiconductor devices having such a structure have a problem in that if gold wires having a diameter of approximately 25 μm are used to wire-bond the high frequency signal input/output pads, only a single gold wire can be connected to each pad since the gold ball portion of the gold wire is approximately 70 μm in diameter. Therefore, as the operational frequency of the high frequency semiconductor element increases, so does the influence of the inductance component of the gold wire in each wire bonding connection portion, resulting in increased high-frequency signal loss. This will degrade the high frequency characteristics.

For example, when a high frequency semiconductor element is mounted in a package using a single gold wire for each high frequency signal input/output pad, the high-frequency signal loss in the wire bonding connection portion for each input/output pad is approximately 0.5 dB at 10 GHz, approximately 2 dB at 30 GHz, and approximately 6 dB at 50 GHz.

The inductance component of the wire bonding connection portion may be effectively reduced by increasing the number of gold wires or increasing the diameter of each gold wire. However, both cases require the line width of the high frequency signal input/output pad to be increased, resulting in a difference in line width between the high frequency signal input/output pad and the high frequency signal transmission line.

A difference between the line widths of the high frequency signal input/output pad and the high frequency signal transmission line results in an impedance mismatch, which increases the reflection loss. For example, when both of them have a line width of 70 μm, the reflection loss is −30 dB or less at 30 GHz. On the other hand, when the line width of the high frequency signal input/output pad is increased to 150 μm (that is, the line width difference is 70 μm), the reflection loss increases to −20 dB at 30 GHz. That is, there is a reflection loss increase of as much as 10 dB.

SUMMARY OF THE INVENTION

The present invention has been devised in view of the above problems. It is, therefore, an object of the present invention to provide a high frequency semiconductor device adapted to reduce degradation in the high frequency characteristics of its wire bonding, connection portions at high operational frequencies without causing an impedance mismatch.

According to one aspect of the present invention, a high frequency semiconductor device comprises a semiconductor substrate, a high frequency semiconductor element formed on the semiconductor substrate, a high frequency signal transmission line formed on the semiconductor substrate such that one end of the high frequency signal transmission line is connected to the high frequency semiconductor element, a high frequency signal input/output pad formed on the semiconductor substrate and connected to the other end of the high frequency signal transmission line such that the high frequency signal input/output pad extends perpendicular to the length direction of the high frequency signal transmission line, and ground potential pads formed on the semiconductor substrate such that the ground potential pads are disposed on opposite longitudinal sides of the high frequency signal input/output pad.

According to another aspect of the present invention, a high frequency semiconductor device comprises, a semiconductor substrate, a high frequency semiconductor element formed on the semiconductor substrate, a high frequency signal transmission line formed on the semiconductor substrate such that one end of the high frequency signal transmission line is connected to the high frequency semiconductor element, a high frequency signal input/output pad formed on the semiconductor substrate and connected to the other end of the high frequency signal transmission line such that the high frequency signal input/output pad extends perpendicular to the length direction of the high frequency signal transmission line, a first ground potential pad formed on the semiconductor substrate such that it is located near the side of the high frequency signal input/output pad opposite to the side connected to the high frequency signal transmission line and encloses the high frequency signal input/output pad on three sides, and a second ground potential pad formed on the semiconductor substrate such that it is located near the side of the high frequency signal input/output pad connected to the high frequency signal transmission line.

DETAILED DESCRIPTION OF THE PREFERRED EMBODIMENTS

First Embodiment

Figure 1:
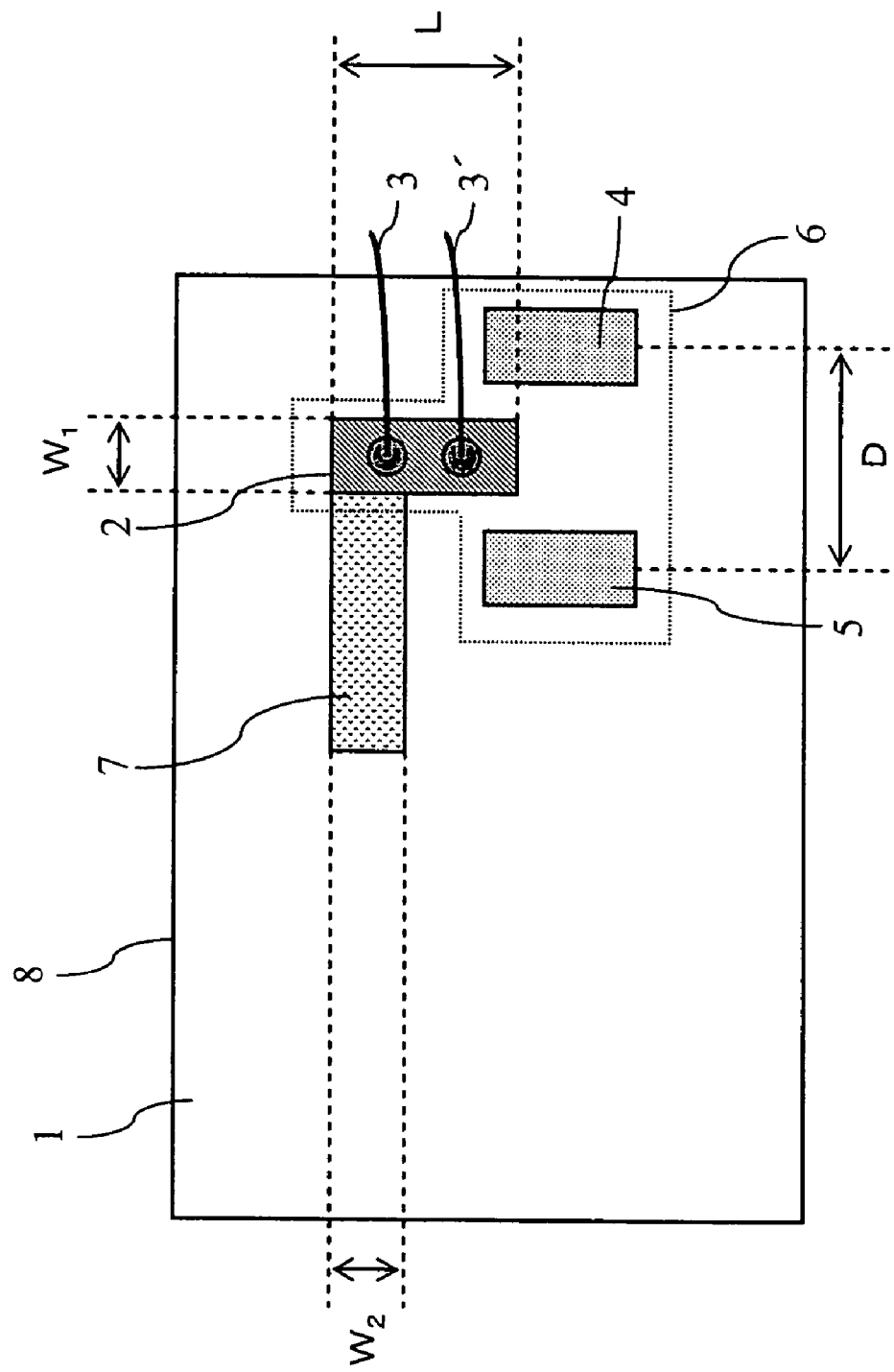
FIG. 1 is an enlarged plan view of a high frequency characteristics measurement pad and the surrounding area in a high frequency semiconductor device according to a first embodiment.

FIG. 1 is an enlarged plan view of a high frequency characteristics measurement pad and the surrounding area in a high frequency semiconductor device according to a first embodiment of the present invention.

Referring to FIG. 1, a high frequency semiconductor element 1, a high frequency signal transmission line 7, and a high frequency signal input/output pad 2 are formed on a semiconductor substrate 8. One end of the transmission line 7 is electrically connected to the high frequency semiconductor element 1, and the other end is connected to the input/output pad 2. Further, gold wires 3 and 3' are connected to the high frequency signal input/output pad 2 as bonding wires. When the high frequency semiconductor element 1 is mounted in a package (not shown), the gold wires 3 and 3' are connected to terminals of the package.

Further, ground potential pads 4 and 5 are formed on opposite sides of the high frequency signal input/output pad 2. These three pads constitute a high frequency characteristics measurement pad 6.

A first characteristic of the present embodiment is that the high frequency signal input/output pad 2 is connected to one end of the high frequency signal transmission line 7 such that the longitudinal direction of the input/output pad 2 is perpendicular to the length direction of the high frequency signal transmission line 7. This arrangement allows a plurality of gold wires to be connected to the high frequency signal input/output pad 2 such that their connection points are arranged in a line along the longitudinal direction of the high frequency signal input/output pad 2 while allowing the pad width W1 of the high frequency signal input/output signal pad 2 to be set substantially equal to the line width W2 of the high frequency signal transmission line 7. Therefore, it is possible to reduce degradation in the high frequency characteristics of the wire bonding connection portions (i.e., gold wires, etc.) at high operational frequencies without causing an impedance mismatch.

For example, if a GaAs substrate having a thickness of approximately 100 μm is used as the semiconductor substrate 8, the line width $W_2$ of the high frequency signal transmission line 7 is set to approximately 70 μm to set the characteristic impedance to approximately 50 O. In this case, according to the present embodiment, the pad length L and the pad width $W_1$ of the high frequency signal input/output pad 2 and the distance D between the ground potential pads 4 and 5 preferably satisfy the following equations:

$L \geq 150$ μm, $W_1 \approx 70$ μm, and $D \approx 300$ μm.

Further, a second characteristic of the present embodiment is that if the high frequency semiconductor element has a plurality of high frequency characteristics measurement pads having the above configuration, these pads are arranged so that, when probes are pressed against the pads to measure the characteristics of the semiconductor element, adjacent probes face in opposite directions. That is, adjacent high frequency signal input/output pads are connected to their respective high frequency signal transmission lines (which are parallel to each other) such that these input/output pads extend perpendicular to the length direction of the transmission lines in opposite directions (as shown in FIG. 2).

Figure 2:
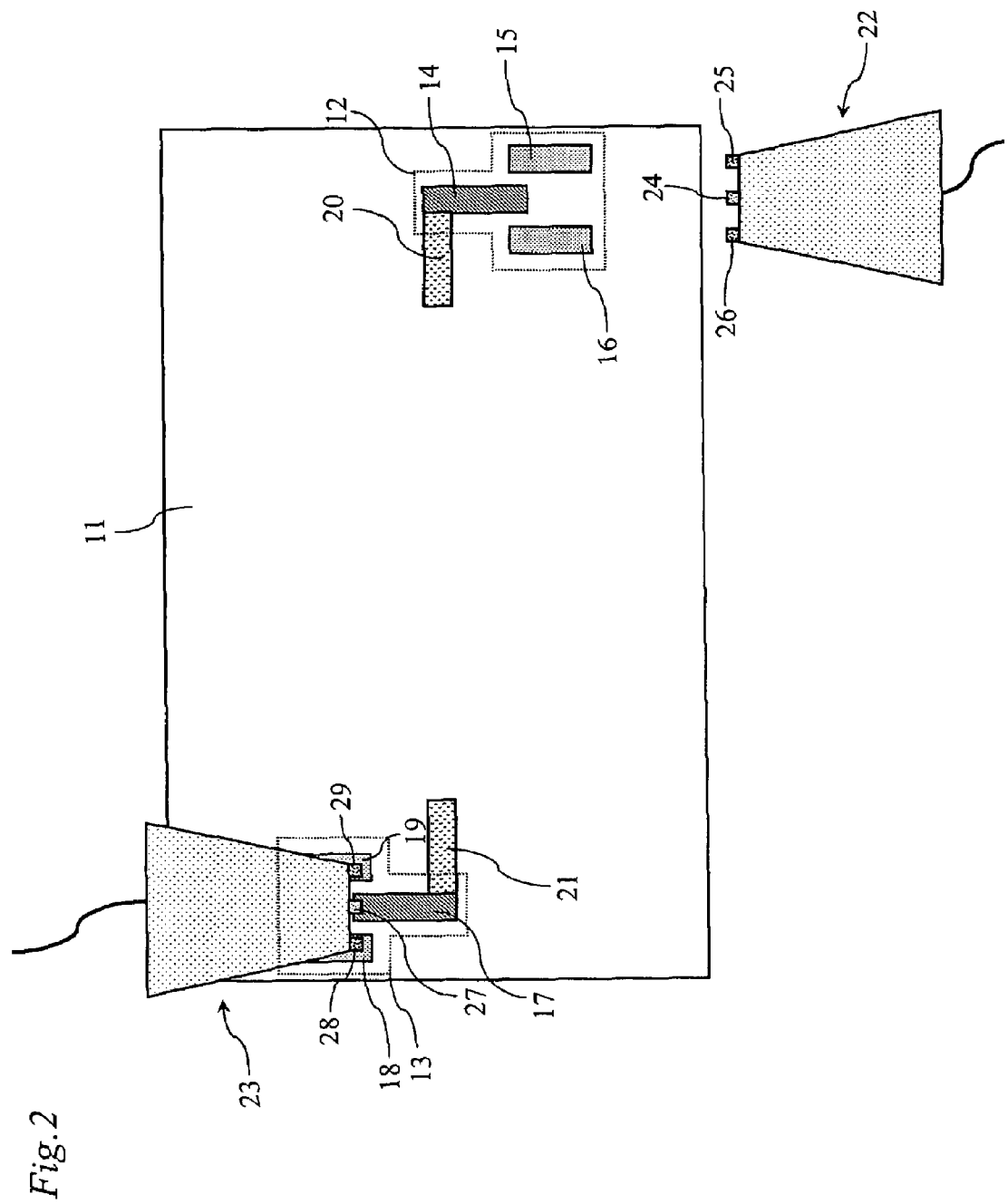
FIG. 2 is a plan view of a high frequency semiconductor element having a plurality of high frequency signal characteristics measurement pads according to a first embodiment.

FIG. 2 is a plan view of a high frequency semiconductor element having a plurality of high frequency signal characteristics measurement pads according to the present embodiment.

Referring to FIG. 2, a high frequency semiconductor element 11 has two high frequency characteristics measurement pads 12 and 13 thereon. The high frequency characteristics measurement pad 12 includes a high frequency signal input/output pad 14 and ground potential pads 15 and 16. The high frequency characteristics measurement pad 13, on the other hand, includes a high frequency signal input/output pad 17 and ground potential pads 18 and 19.

Referring still to FIG. 2, the high frequency signal transmission lines 20 and 22 are arranged parallel to each other. The high frequency signal input/output pads 14 and 17 are connected to high frequency signal transmission lines 20 and 21, respectively, such that these input/output pads 14 and 17 extend perpendicular to the length direction (the horizontal direction in the figure) of the transmission lines 20 and 21 in opposite directions. (In FIG. 2, the input/output pad 14 extends downwardly from the transmission line 20, while the input/output pad 17 extends upwardly from the transmission line 21.)

This arrangement allows high frequency characteristics measurement probes 22 and 23 to face in opposite directions, as shown in FIG. 2, when they are pressed against the high frequency characteristics measurement pads 12 and 13, respectively, preventing such situations in which use of one probe interferes with the other probe when the characteristics of the semiconductor element are measured.

Referring still to FIG. 2, it should be noted that when the characteristics of the high frequency semiconductor element are measured, a high frequency signal transmission probe 24 is pressed against the high frequency signal input/output pad 14, and ground potential probes 25 and 26 are pressed against the ground potential pads 15 and 16. Likewise, a high frequency signal transmission probe 27 is pressed against the high frequency signal input/output pad 17, and ground potential probes 28 and 29 are pressed against the ground potential pads 18 and 19.

Second Embodiment

Figure 3:
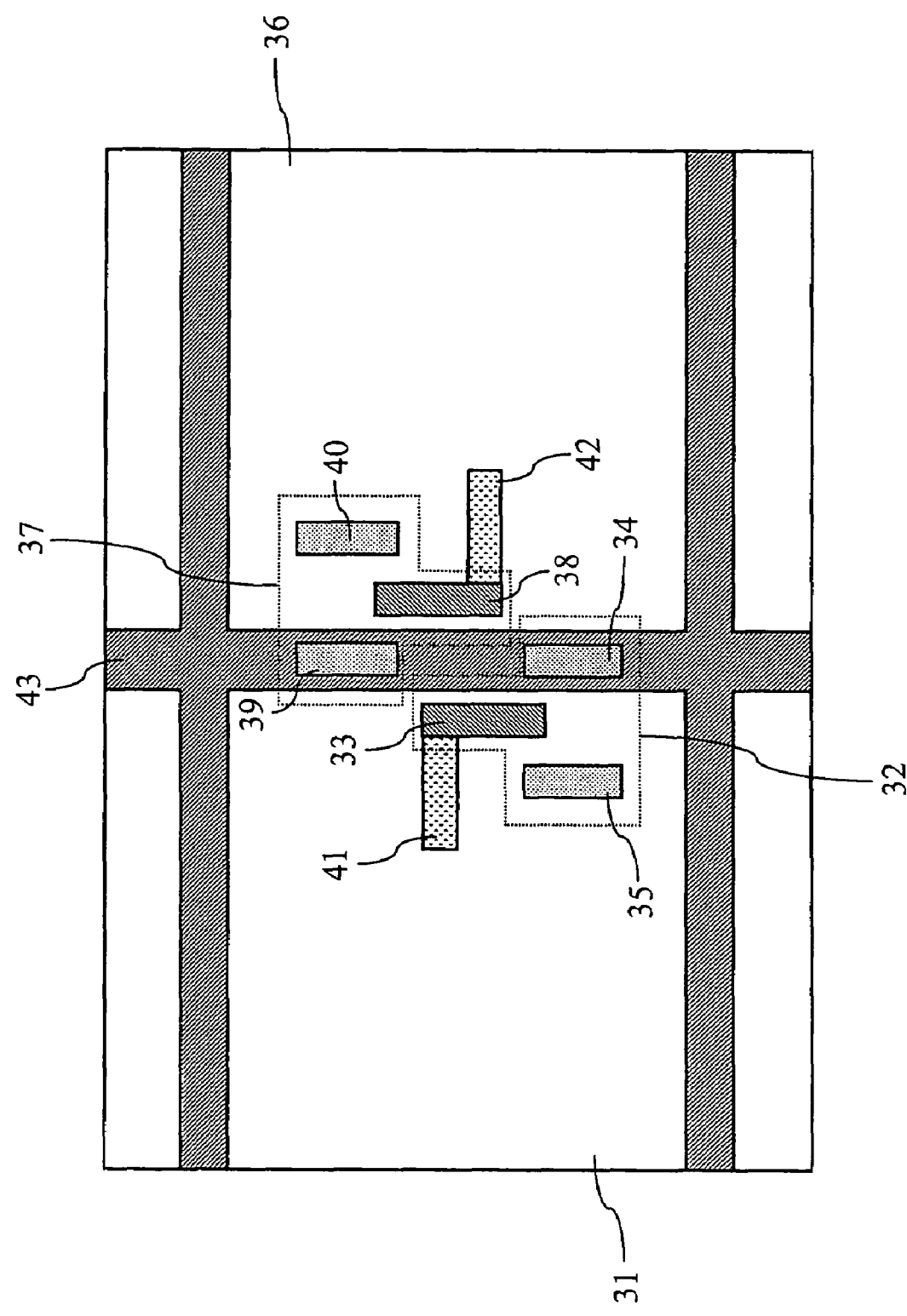
FIG. 3 is an enlarged plan view of a high frequency characteristics measurement pad and the surrounding area in a high frequency semiconductor device according to a second embodiment.

FIG. 3 is an enlarged plan view of high frequency characteristics measurement pads and the surrounding areas on high frequency semiconductor elements according to a second embodiment of the present invention.

Referring to FIG. 3, a high frequency semiconductor element 31 has a high frequency characteristics measurement pad 32 thereon that includes a high frequency signal input/output pad 33 and two ground potential pads 34 and 35. Likewise, a high frequency semiconductor element 36 has a high frequency characteristics measurement pad 37 thereon that includes a high frequency signal input/output pad 38 and two ground potential pads 39 and 40.

According to the present embodiment, the high frequency signal input/output pad 33 is connected to one end of a high frequency signal transmission line 41 such that the longitudinal direction of the input/output pad 33 is perpendicular to the length direction of the transmission line 41, as in the first embodiment. Further, the high frequency signal input/output pad 38 is connected to one end of a high frequency signal transmission line 42 such that the longitudinal direction of the input/output pad 38 is perpendicular to the length direction of the transmission line 42.

The high frequency characteristics measurement pads 32 and 37 are arranged so that, when probes (not shown) are pressed against the pads to measure the characteristics of the semiconductor elements, these probes face in opposite directions. That is, the high frequency signal input/output pads 33 and 38 are connected to the high frequency signal transmission lines 41 and 42 (which are parallel to each other), respectively, such that these input/output pads 33 and 38 extend perpendicular to the length direction of the transmission lines 41 and 42 in opposite directions.

The above arrangement allows a plurality of gold wires (or bonding wires) to be connected to the high frequency signal input/output pad 33 such that their connection points are arranged in a line along the longitudinal direction of the input/output pad 33 while allowing the width of the input/output pad 33 to be set equal to the width of the high frequency signal transmission line 41. Likewise, this arrangement also allows a plurality of gold wires (or bonding wires) to be connected to the high frequency signal input/output pad 38 such that their connection points are arranged in a line along the longitudinal direction of the input/output pad 38 while allowing the width of the input/output pad 38 to be set equal to the width of the high frequency signal transmission line 42. Therefore, it is possible to reduce degradation in the high frequency characteristics of the wire bonding connection portions at high operational frequencies without causing an impedance mismatch.

Further, as described above, the high frequency characteristics measurement probes face in opposite directions when they are pressed against the high frequency characteristics measurement pads 32 and 37, preventing such situations in which use of one probe interferes with the other probe when the characteristics of the semiconductor elements are measured.

The present embodiment is different from the first embodiment in that one of each pair of ground potential pads (in FIG. 3, the ground potential pads 34 and 39) is disposed on a dicing line 43. Therefore, after measuring the characteristics of the semiconductor elements, the substrate is cut along the dicing line 43 and then gold wires are connected to the high frequency signal input/output pads 33 and 38. Then, when the high frequency semiconductor elements 31 and 36 are each mounted in a package, the gold wires are connected to the terminals of the package.

Figure 4:
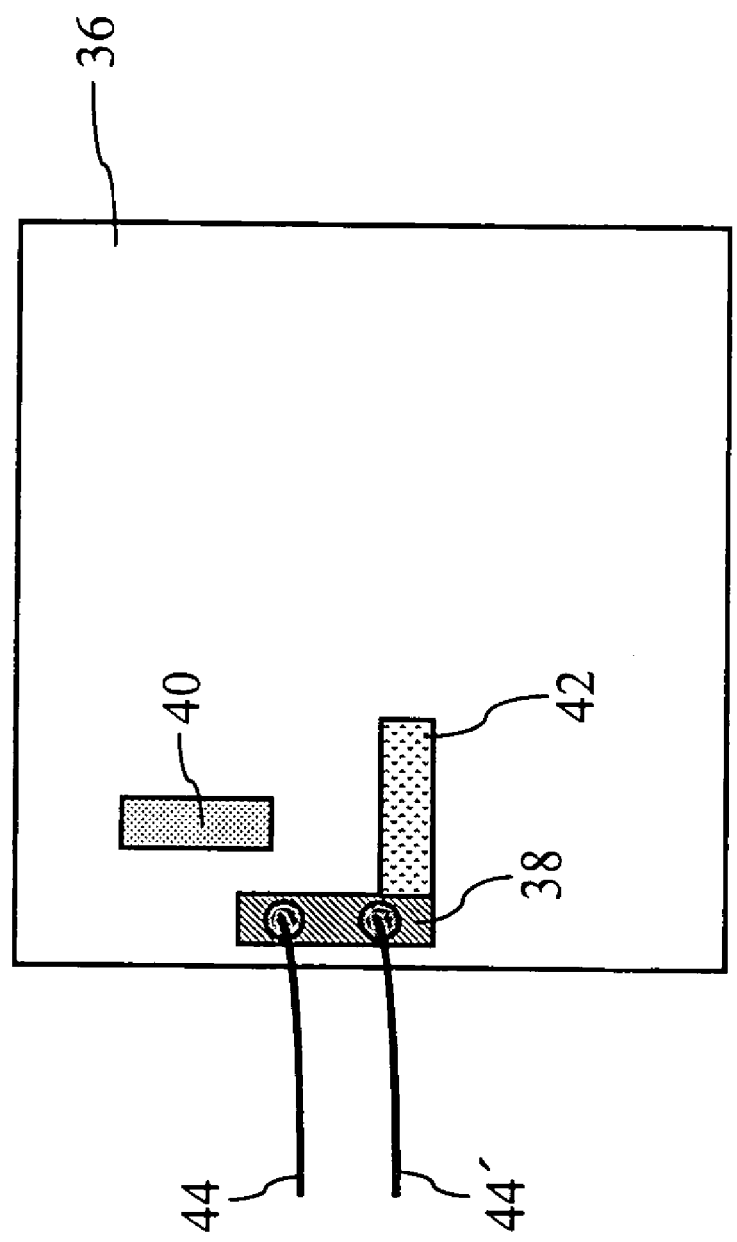
FIG. 4 is a plan view of the high frequency semiconductor element in which gold wires are connected to the high frequency signal input/output pad according to a second embodiment.

FIG. 4 is a plan view of the high frequency semiconductor element 36 (cut out at the above cutting step) in which gold wires (or bonding wires) 44 and 44' are connected to the high frequency signal input/output pad 38.

According to the present embodiment, since, as described above, one of each pair of ground potential pads is disposed on a dicing line, these ground potential pads on dicing lines can be removed when the wafer is cut along the dicing lines after measuring the characteristics of the semiconductor elements. Therefore, the chip size can be reduced by the size of the removed ground potential pads, as compared to conventional high frequency semiconductor elements. Furthermore, it is possible to reduce the length of the gold wires used for wire bonding and thereby reduce degradation in the characteristics of the wire bonding connection portions.

Third Embodiment

Figure 5:
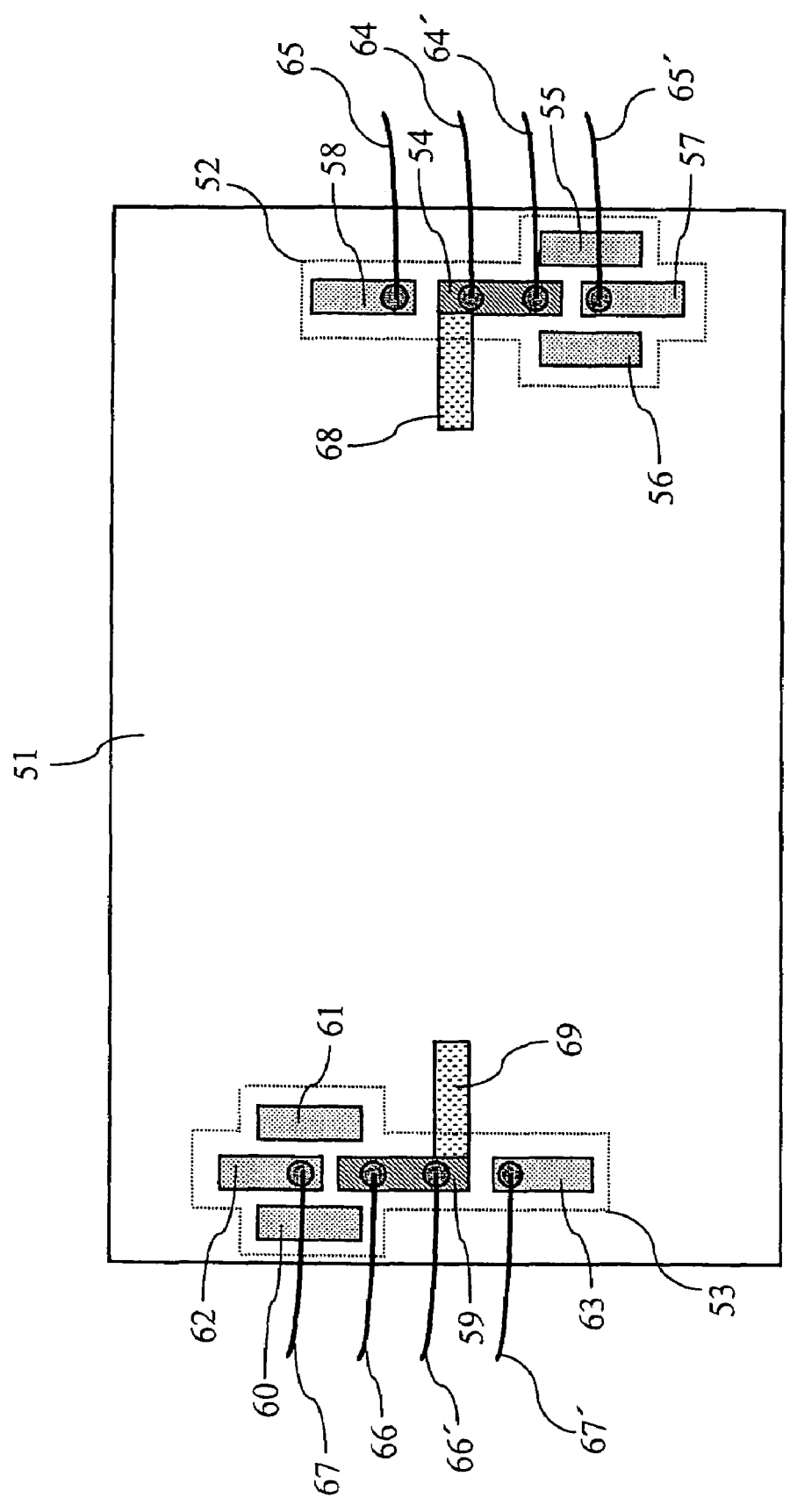
FIG. 5 is an enlarged plan view of a high frequency characteristics measurement pad and the surrounding area in one high frequency semiconductor device according to a third embodiment.

FIG. 5 is an enlarged plan view of high frequency characteristics measurement pads and the surrounding areas on a high frequency semiconductor element according to a third embodiment of the present invention.

Referring to FIG. 5, a high frequency semiconductor element 51 has two high frequency characteristics measurement pads 52 and 53 thereon. The high frequency characteristics measurement pad 52 includes a high frequency signal input/output pad 54 and four ground potential pads 55, 56, 57, and 58. Likewise, the high frequency characteristics measurement pad 53 includes a high frequency signal input/output pad 59 and four ground potential pads 60, 61, 62, and 63.

Specifically, the present embodiment is characterized in that: ground potential pads 57 and 58 are provided near the opposite longitudinal ends of the high frequency signal input/output pad 54, in addition to ground potential pads 55 and 56 provided on opposite sides of the input/output pad 54; and ground potential pads 62 and 63 are provided near the opposite longitudinal ends of the high frequency signal input/output pad 59, in addition to ground potential pads 60 and 61 provided on opposite sides of the input/output pad 59.

The above arrangement allows ground potential wires 65 and 65' to be laid parallel to gold wires (or bonding wires) 6 and 64' connected to the high frequency signal input/output pad 54. Likewise, this arrangement also allows ground potential wires 67 and 67∝ to be laid parallel to gold wires (or bonding wires) 66 and 66' connected to the high frequency signal input/output pad 59. With this, it is possible to reduce degradation in the characteristics of the wire bonding connection portions.

According to the present embodiment, the high frequency signal input/output pad 54 is connected to one end of a high frequency signal transmission line 68 such that the longitudinal direction of the input/output pad 54 is perpendicular to the length direction of the transmission line 68, as in the first embodiment. Further, the high frequency signal input/output pad 59 is connected to one end of a high frequency signal transmission line 69 such that the longitudinal direction of the input/output pad 59 is perpendicular to the length direction of the transmission line 69.

The high frequency characteristics measurement pads 52 and 53 are arranged so that, when probes (not shown) are pressed against the pads to measure the characteristics of the semiconductor element, these probes face in opposite directions. That is, the high frequency signal input/output pads 54 and 59 are connected to the high frequency signal transmission line 68 and 69 (which are parallel to each other), respectively, such that these input/output pads 54 and 59 extend perpendicular to the length direction of the transmission lines 68 and 69 in opposite directions.

The above arrangement allows a plurality of gold wires (or bonding wires) to be connected to the high frequency signal input/output 54 such that their connection points are arranged in a line along the longitudinal direction of the input/output pad 54 while allowing the width of the input/output pad 54 to be set equal to the width of the high frequency signal transmission line 68. Likewise, this arrangement also allows a plurality of gold wires (or bonding wires) to be connected to the high frequency signal input/output pad 59 such that their connection points are arranged in a line along the longitudinal direction of the input/output pad 59 while allowing the width of the input/output pad 59 to be set equal to the width of the high frequency signal transmission line 69. Therefore, it is possible to reduce degradation in the high frequency characteristics of the wire bonding connection portions at high operational frequencies without causing an impedance mismatch.

Further, as described above, the high frequency characteristics measurement probes face in opposite directions when they are pressed against the high frequency characteristics measurement pads 52 and 53, preventing such situations in which use of one probe interferes with the other probe when the characteristics of the semiconductor element are measured.

Figure 6:
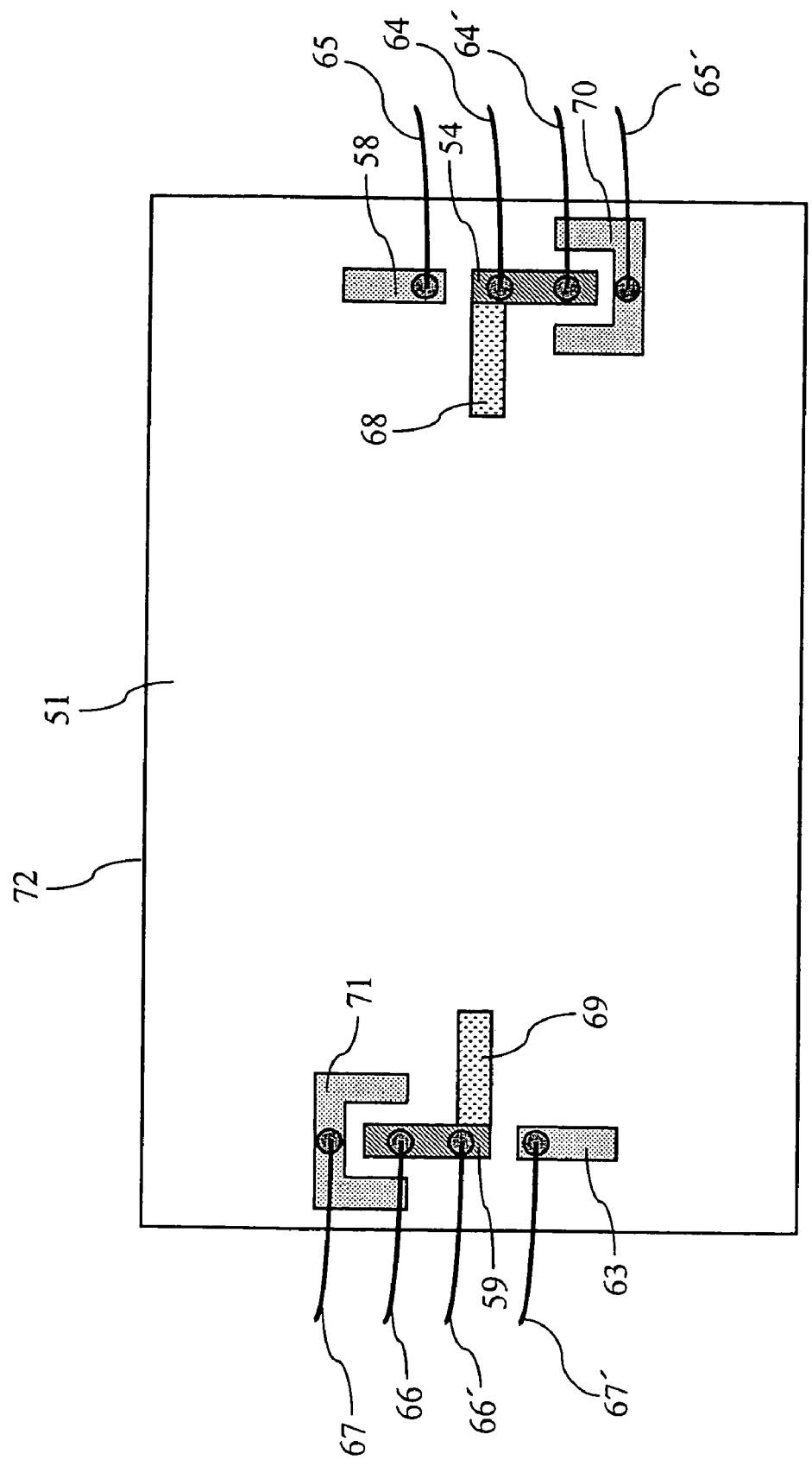
FIG. 6 is an enlarged plan view of a high frequency characteristics measurement pad and the surrounding area in another high frequency semiconductor device according to a third embodiment.

It should be noted that according to the present embodiment the ground potential pads 55, 56, and 57 shown in FIG. 5 may be connected to one another so as to form a combined ground potential pad 70, as shown in FIG. 6. Likewise, the ground potential pads 60, 61, and 62 shown in FIG. 5 may be connected to one another so as to form a combined ground potential pad 71, as shown in FIG. 6.

That is, the ground potential pad 70 is formed on a semiconductor substrate 72 such that it is located near the side of the high frequency signal input/output pad 54 opposite to the side connected to the high frequency signal transmission line 68 and encloses the input/output pad 54 on three sides. The ground potential pad 58, on the other hand, is formed on the semiconductor substrate 72 such that it is located near the side of the high frequency signal input/output pad 54 connected to the high frequency signal transmission line 68.

Likewise, the ground potential pad 71 is formed on the semiconductor substrate 72 such that it is located near the side of the high frequency signal input/output pad 59 opposite to the side connected to the high frequency signal transmission line 69 and encloses the input/output pad 59 on three sides. The ground potential pad 63, on the other hand, is formed on the semiconductor substrate 72 such that it is located near the side of the high frequency signal input/output pad 59 connected to the high frequency signal transmission line 69.

The above arrangement also allows ground potential wires 65 and 65' to be laid parallel to gold wires (or bonding wires) 64 and 64' connected to the high frequency signal input/output pad 54. Further, this arrangement also allows ground potential wires 67 and 67' to be laid parallel to gold wires (or bonding wires) 66 and 66' connected to the high frequency signal input/output pad 59. With this, it is possible to reduce degradation in the characteristics of the wire bonding connection portions, as in the example shown in FIG. 5.

Fourth Embodiment

Figure 7:
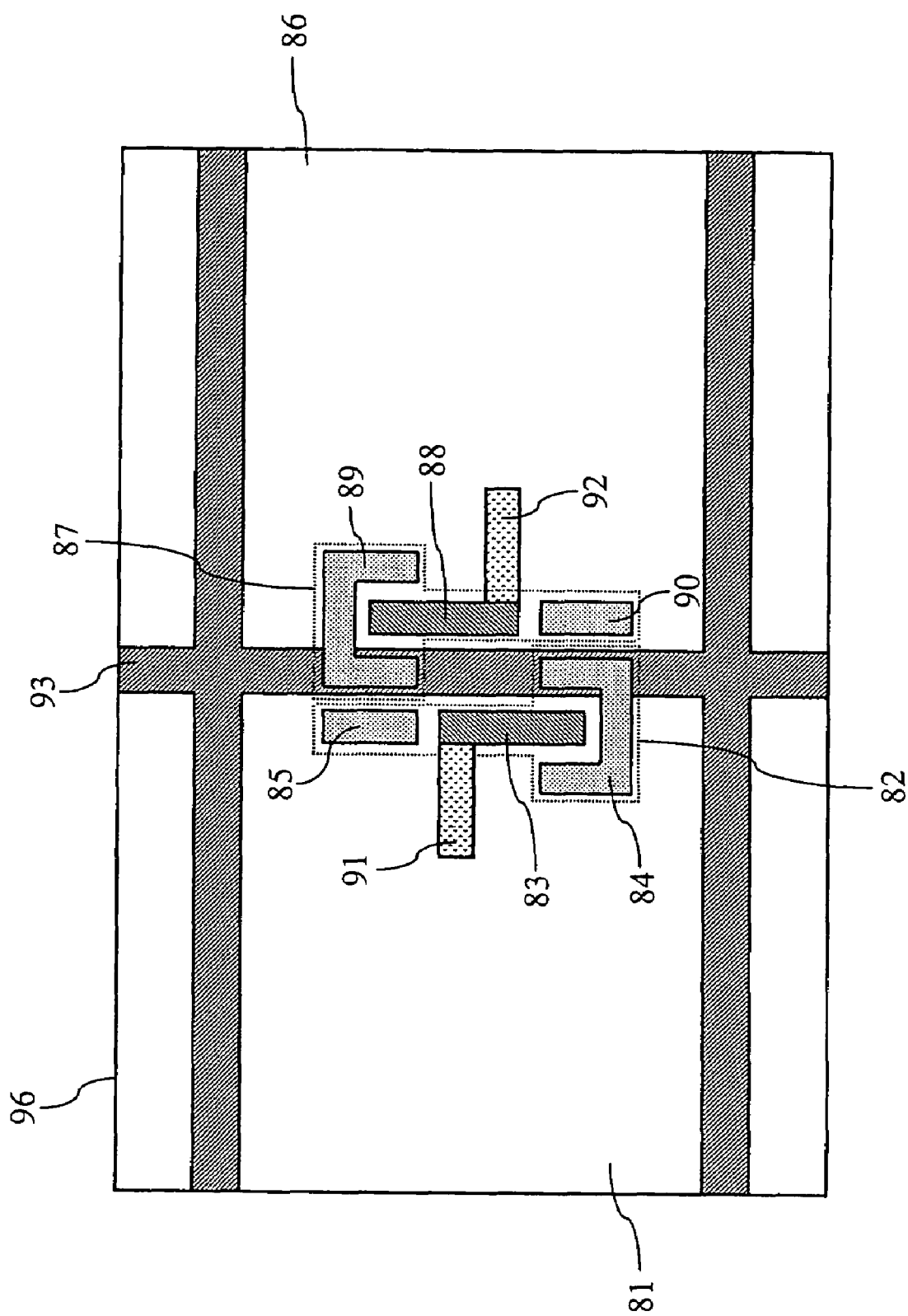
FIG. 7 is an enlarged plan view of a high frequency characteristics measurement pad and the surrounding area in a high frequency semiconductor device according to a fourth embodiment.

FIG. 7 is an enlarged plan view of high frequency characteristics measurement pads and the surrounding areas on high frequency semiconductor elements according to a fourth embodiment of the present invention.

According to the present embodiment, a high frequency signal input/output pad 83 is connected to one end of a high frequency signal transmission line 91 such that the longitudinal direction of the input/output pad 83 is perpendicular to the length direction of the transmission line 91, as in the first embodiment. Further, a high frequency signal input/output pad 88 is connected to one end of a high frequency signal transmission line 92 such that the longitudinal direction of the input/output pad 88 is perpendicular to the length direction of the transmission line 92.

The high frequency characteristics measurement pads 82 and 87 (including the high frequency signal input/output pads 83 and 88, respectively) are arranged so that, when probes (not shown) are pressed against the pads to measure the characteristics of the semiconductor elements, these probes face in opposite directions. That is, the high frequency signal input/output pads 83 and 88 are connected to the high frequency signal transmission lines 91 and 92 (which are parallel to each other), respectively, such that these input/output pads 83 and 88 extend perpendicular to the length direction of the transmission lines 91 and 92 in opposite directions.

The above arrangement allows a plurality of gold wires (or bonding wires) to be connected to the high frequency signal input/output pad 83 such that their connection points are arranged in a line along the longitudinal direction of the input/output pad 83 while allowing the width of the input/output pad 83 to be set equal to the width of the high frequency signal transmission line 91. Likewise, this arrangement also allows a plurality gold wires (or bonding wires) to be connected to the high frequency signal input/output pad 88 such that their connection points are arranged in a line along the longitudinal direction of the input/output pad 88 while allowing the width of the input/output pad 88 to be set equal to the width of the high frequency signal transmission line 92. Therefore, it is possible to reduce degradation in the high frequency characteristics of the wire bonding connection portions at high operational frequencies without causing an impedance mismatch.

Further, as described above, the high frequency characteristics measurement probes face in opposite directions when they are pressed against the high frequency characteristics measurement pads 82 and 87, preventing such situations in which use of one probe interferes with the other probe when the characteristics of the semiconductor elements are measured.

Further according to the present embodiment, the high frequency characteristics measurement pad 82 (on a high frequency semiconductor element 81) includes the high frequency signal input/output pad 83 and two ground potential pads 84 and 85, as shown in FIG. 7. The ground potential pad 84 is formed on a semiconductor substrate 96 such that it is located near the side of the high frequency signal input/output pad 83 opposite to the side connected to the high frequency signal transmission line 91 and encloses the input/output pad 83 on three sides. The ground potential pad 85, on the other hand, is formed on the semiconductor substrate 96 such that it is located near the side of the high frequency signal input/output pad 83 connected to the high frequency signal transmission line 91.

Likewise, the high frequency characteristics measurement pad 87 (on a high frequency semiconductor element 86) includes the high frequency signal input/output pad 88 and two ground potential pads 89 and 90. The ground potential pad 89 is formed on the semiconductor substrate 96 such that it is located near the side of the high frequency signal input/output pad 88 opposite to the side connected to the high frequency signal transmission line 92 and encloses the input/output pad 88 on three sides. The ground potential pad 90, on the other hand, is formed on the semiconductor substrate 96 such that it is located near the side of the high frequency signal input/output pad 88 connected to the high frequency signal transmission line 92.

Further, according to the present embodiment, portions of the ground potential pads 84 and 89 are disposed on a dicing line 93, as shown in FIG. 7. Therefore, after measuring the characteristics of the semiconductor elements, the substrate is cut along the dicing line 93. Then, gold wires are connected to the high frequency signal input/output pads 83 and 88, and ground potential wires are connected to the ground potential pads 84, 85, 89 and 90.

Figure 8:
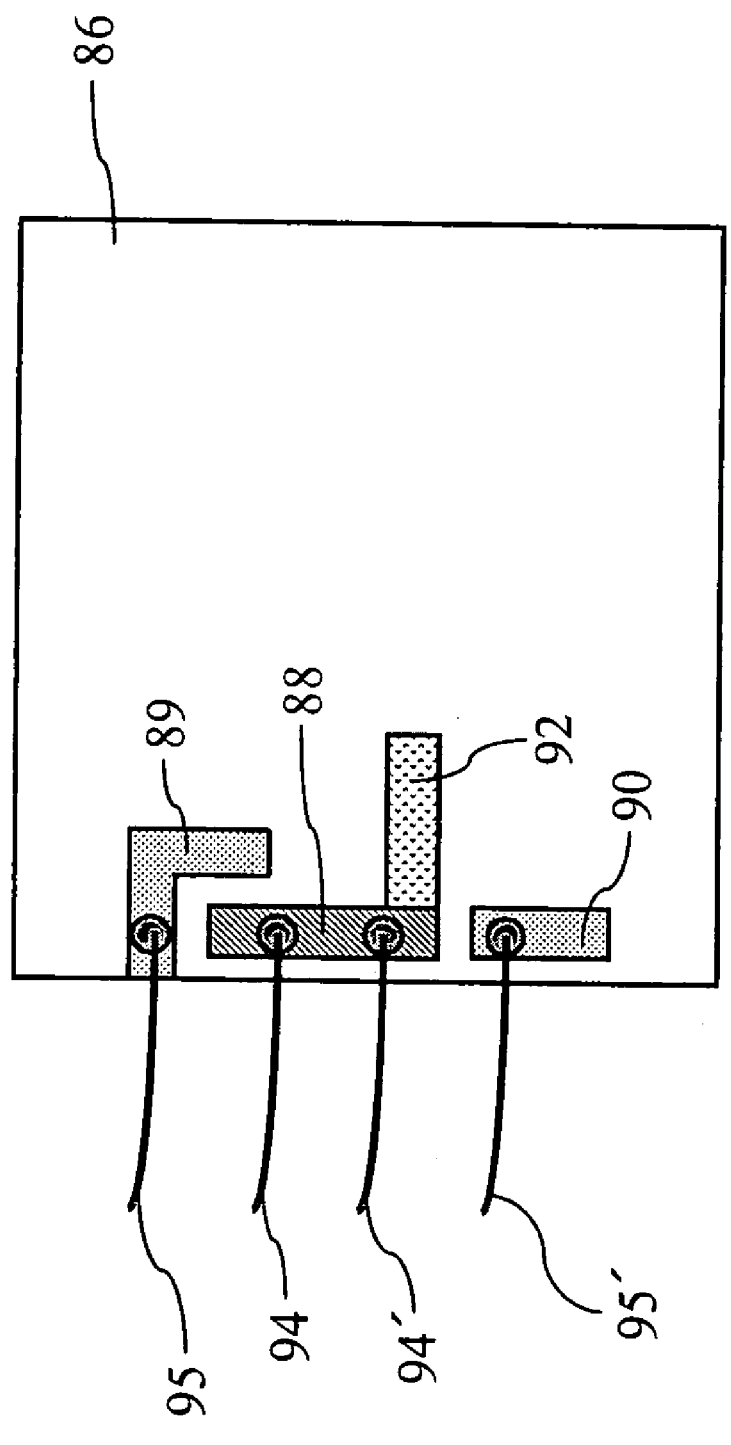
FIG. 8 is a plan view of the high frequency semiconductor element in which gold wires are connected to the high frequency signal input/output pad, and ground potential wires are connected to the ground potential pads, respectively, according to a fourth embodiment.

FIG. 8 is a plan view of the high frequency semiconductor element 86 (cut out at the above cutting step) in which gold wires (or bonding wires) 94 and 94' are connected to the high frequency signal input/output pad 88, and ground potential wires 95 and 95' are connected to the ground potential pads 89 and 90, respectively. As shown in the figure, the present embodiment allows the ground potential wires 95 and 95' to be laid parallel to the gold wires 94 and 94'. As a result, it is possible to reduce degradation in the characteristics of the wire bonding connection portions.

Further according to the present embodiment, since, as described above, portions of ground potential pads are disposed on a dicing line, these (portions of the) ground potential pads can be removed when the substrate is cut along the dicing lines after measuring the characteristics of the semiconductor elements. Therefore, the chip size can be reduced by the size of the removed (portions of the) ground potential pads. Furthermore, it is possible to reduce the length of the gold wires used for wire bonding and thereby reduce degradation in the characteristics of the wire bonding connection portions.

It should be noted that according to the present embodiment the ground potential pad 84 may be divided into three smaller pads and one of these pads may be disposed on the dicing line 93, as shown in FIG. 5 described in connection with the third embodiment. Specifically, one of the two pads provided on the opposite longitudinal sides of the high frequency signal input/output pad 83 may be disposed on the dicing line 93. Likewise, the ground potential pad 89 may be divided into three smaller pads and one of these pads may be disposed on the dicing line 93. Specifically, one of the two pads provided on the opposite longitudinal sides of the high frequency signal input/output pad 88 may be disposed on the dicing line 93. These arrangements also produce the effects described above.

It should be noted that the present invention is not limited to the embodiments described above, and various alterations may be made thereto without departing from the spirit and scope of the invention.

The features and advantages of the present invention may be summarized as follows.

As described above, the present invention can provide a high frequency semiconductor device adapted to reduce degradation in the high frequency characteristics of its wire bonding connection portions at high operational frequencies without causing an impedance mismatch.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-049042, filed on Feb. 24, 2005 including specification, claims, drawings and summary, on which the Convention priority of the present application is based, are incorporated herein by reference in its entirety.

What is claimed is:

1. A high frequency semiconductor device comprising:
    a semiconductor substrate;
    a high frequency semiconductor element on said semiconductor substrate;
    a high frequency signal transmission line on said semiconductor substrate and having a first end connected to said high frequency semiconductor element;
    a high frequency signal input/output pad on said semiconductor substrate and connected to a second end of said high frequency signal transmission line, said high frequency signal input/output pad extending perpendicular to a length direction of said high frequency signal transmission line; and
    ground potential pads on said semiconductor substrate, said ground potential pads being disposed on opposite longitudinal sides of said high frequency signal input/output pad.

2. The high frequency semiconductor device according to claim 1, wherein said high frequency signal input/output pad has a width substantially equal to the width of said high frequency signal transmission line, and including a plurality of bonding wires connected to said high frequency signal input/output pad at connection points arranged in a line along a longitudinal direction of said high frequency signal input/output pad.

3. The high frequency semiconductor device according to claim 1, comprising a plurality of said high frequency signal transmission lines and a plurality of said high frequency signal input/output pads, both on said semiconductor substrate, wherein
    two adjacent high frequency signal input/output pads are connected to respective high frequency signal transmission lines that are parallel to each other, and
    said two adjacent high frequency signal input/output pads extend perpendicular to length direction of said respective high frequency signal transmission lines, in opposite directions.

4. The high frequency semiconductor device according to claim 1, wherein one of said ground potential pads is disposed on a dicing line on a surface of said semiconductor substrate.

5. The high frequency semiconductor device according to claim 1, further comprising ground potential pads located near opposite longitudinal ends of said high frequency signal transmission line.

6. A high frequency semiconductor device comprising:
- a semiconductor substrate;
- a high frequency semiconductor element on said semiconductor substrate;
- a high frequency signal transmission line on said semiconductor substrate and having a first end connected to said high frequency semiconductor element;
- a high frequency signal input/output pad on said semiconductor substrate and connected to a second end of said high frequency signal transmission line, said high frequency signal input/output pad extending perpendicular to length direction of said high frequency signal transmission line;
- a first ground potential pad on said semiconductor substrate and located near a side of said high frequency signal input/output pad, opposite a side connected to said high frequency signal transmission line and enclosing said high frequency signal input/output pad on three sides; and
- a second ground potential pad on said semiconductor substrate, located near said side of said high frequency signal input/output pad connected to said high frequency signal transmission line.

7. The high frequency semiconductor device according to claim 6, wherein said high frequency signal input/output pad has a width substantially equal to the width of said high frequency signal transmission line, and including a plurality of bonding wires connected to said high frequency signal input/output pad at connection points arranged in a line along a longitudinal direction of said high frequency signal input/output pad.

8. The high frequency semiconductor device according to claim 6, comprising a plurality of said high frequency signal transmission lines and a plurality of said high frequency signal input/output pads, both on said semiconductor substrate, wherein two adjacent high frequency signal input/output pads are connected to respective high frequency signal transmission lines that are parallel to each other, and said two adjacent high frequency signal input/output pads extend perpendicular to length direction of said respective high frequency signal transmission lines, in opposite directions.

9. The high frequency semiconductor device according to claim 6, wherein a portion of said first ground potential pad is disposed on a dicing line on a surface of said semiconductor substrate.

* * * * *